PROCESS FOR PRODUCING THERMOELECTRIC ELEMENTS

Filed May 21, 1963

INVENTOR
Frank Emley
BY
C. L. Menzemer
ATTORNEY

United States Patent Office 3,400,452
Patented Sept. 10, 1968

3,400,452

PROCESS FOR PRODUCING THERMOELECTRIC ELEMENTS

Frank Emley, Penn Hills Township, Allegheny County, Pa., assignor to Westinghouse Electric Corporation, Pittsburgh, Pa., a corporation of Pennsylvania Filed May 21, 1963, Ser. No. 282,061
6 Claims. (Cl. 29—573)

The present invention relates to a process for preparing thermoelectric elements employing an elevated temperature and isostatic pressures.

There is a need for a process suitable for producing composite thermoelectric members comprising an outer sheet or jacket of a metal joined to and enclosing a body of a compressed solid which may be a ceramic, semiconductor material or the like.

In particular, in producing thermoelectric devices, one of the most difficult problems is the application of good electrical contacts to a body of the thermoelectric material. The most efficient thermoelectric materials for both cooling and power generation applications are almost always comprised of semiconductor or ceramic-like materials. It is necessary that the electrical contacts which are metallic, be joined or bonded to the thermoelectric material in such a way that the lowest possible electrical drops occurs therebetween. Also, the contact member must be so mechanically or physically joined that it will not loosen or become detached during service conditions when substantial temperature differences prevail in the devices.

Previously, difficulty has been realized in soldering, brazing or otherwise joining a metallic contact to a semiconductor or ceramic thermoelectric material. Some of the problems have been overcome in forming good electrical contact between a thermoelectric member and a metal contact by co-extending the members or by mechanically deforming, such as, by swaging a contact member on the thermoelectric member to form a bond therebetween.

In devices having a complicated configuration, such as, tubular thermoelectric devices, the use of a mechanical deformation process, has a tendency to break down the insulation between the assembled components within the tube and even the cause cracks in the thermoelectric bodies. Furthermore, the mechanically deformed assemblies must usually be sintered in a subsequent operation to provide a unitary device capable of transmitting a current flow.

An object of the present invention is to provide a process for producing a thermoelectric device consisting of a cylindrical metallic sheet and a body of thermoelectric material disposed within and in intimate contact with the metallic cylindrical sheet.

A further object of the invention is to provide a process for forming a thermoelectric element comprising a series of bodies of thermoelectric materials electrically joined in series within an outer cylindrical metal member and an inner cylindrical metal member.

Other objects of the invention will, in part, be obvious and will, in part, appear hereinafter.

For a better understanding of the nature and scope of the invention, reference should be had to the following detailed description and drawings, in which.

Figures 1, 2, 3, 4, 5, 6, 7:
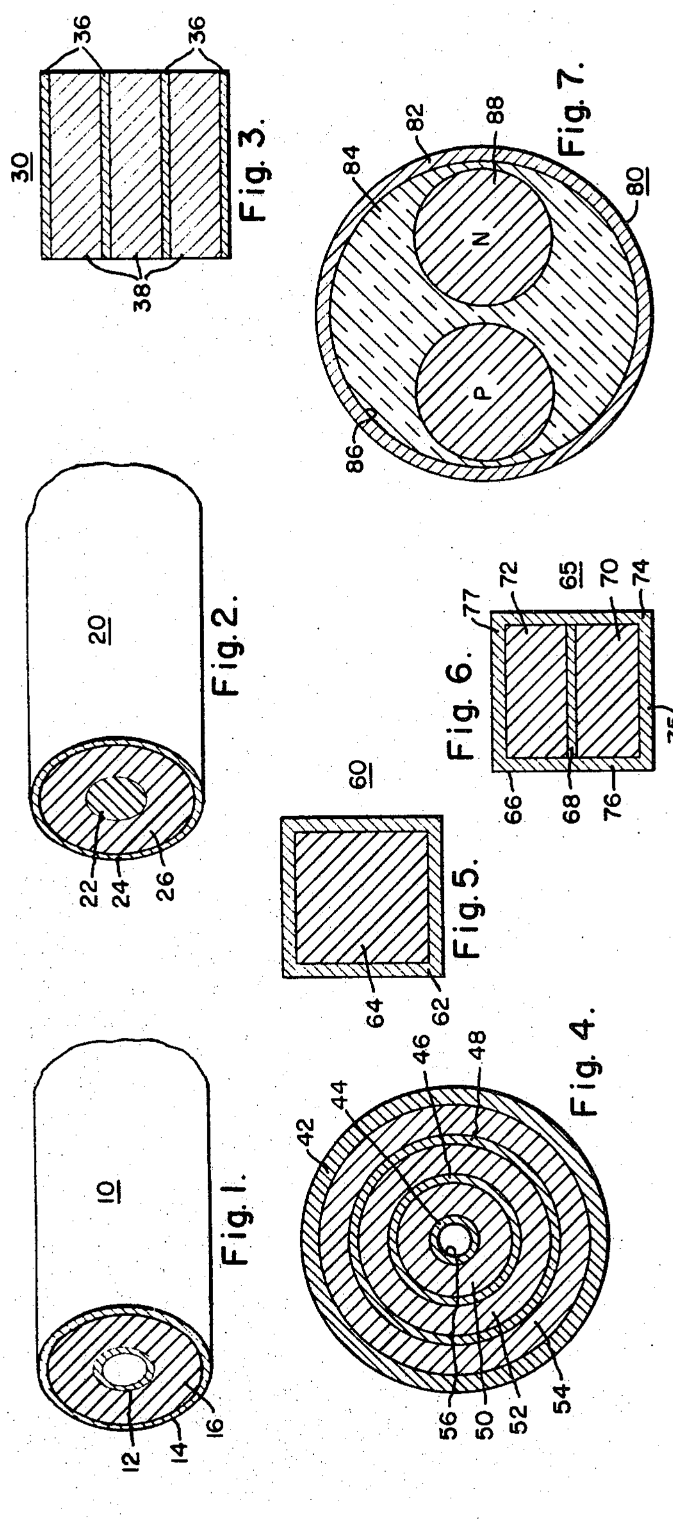
FIGURES 1 and 2 are views in perspective of a thermoelectric element formed in accordance with the process of this invention.
FIG. 3 is a transverse cross-sectional view of a compartmented flat metal member having several flat thermoelectric bodies disposed in and bonded to the walls of the compartments by the method of the invention.
FIG. 4 is a transverse sectional view of a plurality of concentric cylindrical metal members with a plurality of bodies of compressed powdered thermoelectric material disposed therein and joined to the walls of the metal members by the process of the invention.
FIG. 5 is a cross sectional view of a thermoelectric element of square configuration formed in accordance with the teaching of this invention.
FIG. 6 is a cross sectional view of a compartmented thermoelectric element of square configuration.
Figure 8:
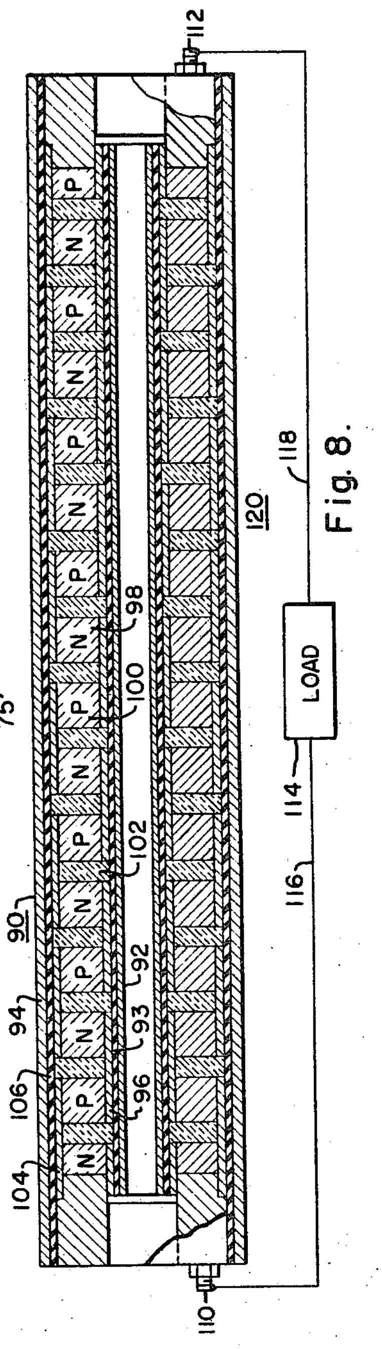

FIG. 7 is a cross sectional view of a two-compartment cylindrical metal member containing compressed bodies of dissimilar thermoelectric materials in the compartments and metallurgically bonded to the walls thereof by the process of the invention; and FIG. 8 is a longitudinal sectional view in elevation of a thermoelectric device comprising a series of thermoelectric bodies electrically joined within an outer cylindrical metal member and an inner cylindrical metal member in accordance with the teachings of this invention.

In accordance with the present invention and in attainment of the foregoing objects there is provided a process for producing a thermoelectric element comprising a body of thermoelectric material metallurgically bonded to at least an outer metal jacket comprising (1) introducing the body of thermoelectric material into a hollow cylindrical metal member having at least one compartment therein formed by the inner walls of the cylindrical member, at least one metal partition member may also be disposed within the cylindrical metal member (in a preferred form of the invention the partition member being a centrally disposed cylindrical member), (2) sealing the ends of the cylindrical member so that the compressed body will be retained therein, (3) evacuating the member, and (4) deforming the same by isostatic pressures at elevated temperatures to effect a selected reduction in area.

In a further modification of the invention, a plurality of compressed bodies of powdered thermoelectric material are assembled within an inner and outer cylindrical metal member. Electrical insulation is interposed between the bodies. Bridging electrical contacts are disposed between certain portions of the bodies of thermoelectric material and the insulation between the cylindrical members and the bridging members, to provide a closely packed assembly. Then the entire assembly is hot pressed at an isostatic pressure of from about 5,000 p.s.i. to 50,000 p.s.i. at a temperature of from about 250° C. to the melting temperature of the lowest melting temperature component of the assembly until the space between the inner and outer cylindrical members has a reduction in area of from about one percent to fifteen percent to provide a metallurgical bond between the thermoelectric bodies and the bridging electrical contacts.

The thermoelectric materials employed herein may comprise metallic and non-metallic substances such as refractory metals, ceramics or semiconductors or mixtures of two or more. The thermoelectric members may be prepared by compressing powdered thermoelectric materials in a suitable die to a density of about 85% and higher or by casting in a manner known to those skilled in the art. The insulating materials employed as partition members and the like between thermoelectric bodies may comprise any good inorganic electrical insulators such as, silica, alumina, boron nitride, and beryllium oxide and inorganic silicates such as boron silicate and lime glasses and those materials comprising the reaction product of mica and lead borate glass sold under the trade name of Mycalex and materials comprising magnesium silicates sold under the trade name Lavite. The cylindrical metal members may comprise a good electrically and thermally conductive material, such as, aluminum, stainless steel, pure iron and copper or base alloys thereof.

In a particular embodiment of the invention, there is provided an integral, elongated, thermoelectric element comprising a series of thermoelectric bodies electrically joined in series within an outer cylindrical metal member and an inner cylindrical metal member electrically insulated therefrom but in good thermal conducting relation therewith. The element is produced by disposing a plurality of inner bridging metal ring members on an insulated cylindrical metal member. The bridging ring members may be electrically insulated from the cylindrical member by disposing a relatively thin insulating cylindrical member therebetween either prepared separately as when employing a material such as boron nitride or produced in situ by plasma jet spraying an insulating material, such as alumina, on the inner cylindrical member. When employing a series of adjacent bridging ring members, they will be electrically insulated from each other. The bridging ring members may comprise any good electrically conductive metal such, for example, as nickel, copper, aluminum, iron or base alloys thereof.

A plurality of compressed washers of powdered thermoelectric material are disposed at one end on the inner bridging ring members and a plurality of outer bridging metal ring members are disposed on the other end of the compressed washer of thermoelectric material so that the thermoelectric washer members are electrically connected at one end thereof by either the inner or outer concentric bridging ring members while the washers are electrically insulated at the other end. The thermoelectric washer members may be prepared by the method described previously. The insulating materials employed between the thermoelectric washers may comprise any of the electrical insulators described previously with respect to the partition members of the less complicated configurations.

The number of thermoelectric washer members employed will determine the number of metal bridging ring members needed to provide electrical contacts thereon. It is preferred that each pair of thermoelectric washers electrically contacted consist of a p-type thermoelectric material and an n-type thermoelectric material. An electrically insulated outer cylindrical metal member is then disposed on the outer bridging metal ring members. The bridging ring members may be electrically insulated from the outer cylindrical member by a cylindrical member comprising a material such as boron nitride, by wrapping the bridging members with about 3 or 4 mils of an insulating material, such as mica or by plasma jet spraying a layer on the inner surface of the outer metal member. The components of the assembly arranged so that the assembly is relatively closely packed so that the total free or gap space in the assembly is not above about one percent of the diameter of the outer cylindrical member.

The resulting elongated thermoelectric member will be processed by removing the ends and attaching electrical leads so that the elements may be connected in an electrical circuit. In the embodiments of the invention wherein a complete thermoelectric device is not produced in a single operation, such as, where a thermoelectric body is bonded to the walls of two concentrically disposed cylindrical metal members, the resulting member may be severed into a plurality of cylindrical units of any desired length which may be further machined, or the member may be severed into relatively small individual thermoelectric pellets of desired shape. The cylindrical units or pellets may be joined to other thermoelectric pellets to produce composite thermoelectric elements and assemblies which may be electrically connected, and suitably insulated both electrically and thermally, into thermoelectric power generators or cooling devices.

It is particularly desirable in all embodiments of the invention that the unit being deformed or hot pressed be evacuated prior to deformation to remove all gases.

The term "isostatic pressure" or "isostatic deformation" or "isostatic hot pressing" as used herein refers to a method for reducing the cross sectional area of a member to a sufficient degree to bond said member to the mating face of another member by the uniform application of pressures induced by using gases and liquids as a compressing medium to the very high pressures indicated. Although the pressures preferred range from 5,000 to 50,000 p.s.i., it should be appreciated that higher or lower pressures may be employed depending upon the materials involved in the assembly, temperature, time of application of temperature and pressure, and other factors. It should be understood also, that the main objective is to produce good bonds between mating faces and when close tolerances between components are present, the amount of deformation required to provide bonds may be insignificant.

The temperatures employed in the process are selected by reference to many considerations. In assemblies where some of the components may have dissimilar expansivity, in order to minimize joint stresses on cooling, the joining temperature should be selected at the lowest possible temperature which will effect a satisfactory bond of all components. Generally, the temperature chosen by the above consideration will be best for bonding any assembly whether there is expansivity mismatch between components or not. Other considerations are modulus of elasticity of the various materials and quality of the bonds in order to achieve the best bonded assembly with the minimum of internal stresses.

The period of time of application of temperature and pressure is selected by the consideration of allowing all parts of the assembly to achieve thermal equilibrium, and that of allowing diffusion to occur to effect the bonds between adjacent components of the assembly. This latter requirement is usually determined by experiment in each case. Experimental data has indicated that many bonds can be formed in fifteen minutes of heating, but periods of two hours appear to be more reliable. Bonding may be speeded up, or accomplished at lower temperatures or pressures, if desired, by adding joint promoters of various kinds, such as, rapidly diffusing elements as is well known in the recent art.

The primary feature of the invention is that bonds between all the components may be formed in a single operation. That is, the proposed assembly may be disposed in a suitable pressure vessel, such as, an autoclave containing a heating coil and the desired temperatures, pressures and times for each particular assembly are imposed. After removal from the pressure vessel all the necessary bonds are provided so that the only processing necessary thereafter is of a mechanical nature so that the completed unit may be integrated in some type of an electrical circuit.

Referring to FIG. 1, there is shown an isostatically hot pressed thermoelectric element 10, after the ends of the element are removed, consisting of an inner hollow cylindrical metal contact member 12 and an outer cylindrical concentric metal contact member 14 with a body 16 of compressed powered thermoelectric material disposed therebetween and metallurgically bonded to the walls of the metal members 12 and 14. Surprisingly good bonding is effected between the metal walls and the body 16. The thermoelectric material body 16 may consist of any one of p- or n-type materials or two or more suitable layers in sequence.

The metals used in forming the members 12 and 14 are selected on the basis of their compatibility with the thermoelectric material, desired electrical and temperature characteristics and resistance to corrosive atmospheres for a given application.

When employing the isostatically hot pressed thermoelectric element 10 in an operational device, it is often desirable to connect two or more of either p- or n-type, or atlernate p-n type elements in a particular type of arrangement and circuitry.

Referring to FIG. 2, there is shown a modified isostatically hot pressed or deformed thermoelectric element 20 wherein the inner cylindrical metal member 22 is a solid rod. The element comprises a concentric cylindrical metal contact member 24 with a compressed body of powdered thermoelectric material 26 disposed between the two metal members and metallurgically bonded to the walls of the same. If desired, the rod 22 may be suitably machined as by boring or etching to provide a hollow center in the element 20.

The inner hollow contact member 12 of FIG. 1 not only serves to carry electrical current, but enables a cooling fluid such as water or air to be conveyed to dissipate heat if it comprises the hot junction of a refrigerating device. If the element 10 is employed as part of an electrical generator, hot gases, liquid or other heat source may be disposed in or passes through the hollow contact member 12. The outer contact member 14 may cool a space or it may dissipate heat at a cold sink in either of these cases. The functions of the outer contact member 14 and the inner contact member 12 can be reversed.

Referring to FIG. 3, there is shown a thermoelectric plate element 30. The element 30 consists of metal contact members 36 and thermoelectric material layers 38 disposed between the contact members and joined in firm and intimate contact with the surfaces thereof. The width of each compartment is designed for a certain thermal gradient which will be encountered by the final element in service. It should be understood that the thermoelectric materials 38 are arranged so that one flat base of the resulting element 30 can function as a hot junction and the other flat base a cold junction with maximum efficiency. The element 30 may then be severed laterally or diced into a plurality of elements or it may be employed as a single unit.

Similarily, a thermoelectric eltment of initially a square or rectangular cross-section may be isostatically hot pressed.

For a modification of the structure of FIGURES 1 and 2, reference should be had to FIGURE 4, showing a cylindrical annular compartmented member 40 comprising a hollow outer casing 42 fitted with a plurality of cylindrical concentric partitions 44, 46 and 48 and bodies 50, 52 and 54 of thermoelectric material disposed in the spaces between the partitions. This modification employs thermoelectric materials in a manner similar in principle to that indicated with respect to FIG. 3, in that, the thickness and composition of the respective thermoelectric materials 50, 52 and 54 can be varied to provide highest efficiency during operation over a certain thermal gradient. The partitions may be cast or formed as an integral part of the original casing 42 or may be separate tubes inserted thereafter. As indicated by the drawing, the inner cylindrical partition 44 has a hollow 56. A heat engendering material may be placed in hollow 56. Further, an innermost solid rod may be employed in place of hollow cylinder 44. Also, an inner bore may be machined in the solid rod after isostatic hot pressing. After outgassing, the member may be sealed and isostatically hot pressed.

After isostatic hot pressing, the thermoelectric material layers will be reduced in cross-section and bonded in firm and intimate contact with the surfaces of the reduced thickness of metal walls of the member. After isostatic hot pressing, the thermoeltctric element may be sectioned so that the thermoelectric material and partitions are exposed. These sections can be joined to other sections in producing thermoelectric devices.

With reference to FIG. 5, a thermoelectric element 60 comprising a cylindrical metal member 62 of square configuration and a thermoelectric body 64 disposed therein, as shown. The body 64 is intimately bonded to the inner walls of the metal member 62 and may be diced to provide a considerable number of thermoelectric pellets.

With reference to FIG. 6, there is shown an isostatically hot pressed compartment thermoelectric element 65 comprising a cylindrical metal member 66 of a square configuration and a partition member 68 which may be either a metal or an insulator. The bodies of thermoelectric materials 72 and 74 disposed in the compartments may be of a different composition, for example, a p-type material in one compartment and an n-type material in the other compartment. After isostatic deformation the sides of the outer metal claddings 74 and 76 may be removed leaving the upper and lower metal faces 75 and 77 intact and the elongated member 65 may be diced into suitable lengths and electrically conductive straps may be soldered across the metal faces 75 and 77 of the bodies of p-type thermoelectric material and n-type thermoelectric material to provide a thermoelectric couple.

Referring to FIG. 7, a thermoelectric element 80 is shown after isostatic deformation and may be processed to produce thermoelectric couples. A metal jacket 82 comprising a deformable electrically and thermally insulating material 84, such as alumina, having circular bores 86 and 88 in which are disposed compacted p-type material in bore 86 and in n-type material in bore 88. The deformed element may be treated to remove jacket 82, then it may be diced into desired lengths and an electrically conductive metal strap may be soldered across one end of each diced unit consisting of a p- and an n-type material to provide a thermoelectric couple.

Referring to FIG. 8, there is shown a thermoelectric device 120 comprising an isostatically deformed thermoelectric element 90. The element 90 comprises an inner cylindrical metal member 92 and a concentric outer cylindrical metal member 94. An insulating hollow cylindrical member 93 is disposed about and joined to member 92, the member 93 comprising a material, such as alumina, porcelain, mica and boron nitride. However, the insulating material may be plasma jet sprayed on the outer surfaces of the inner cylindrical member. A plurality of inner bridging ring members 96 are disposed about and joined to the insulating member 93, the ring members being electrically insulated from each other by means of insulating washers 102 comprising materials such as, mica, or those selling under the trade name of Lavite or Mycalex disposed between the ring members. A plurality of washer members of thermoelectric material are disposed on and joined to the bridging metal ring member 96, each alternate thermoelectric washer comprising an n-type thermoelectric material 98, such as, lead telluride or a p-type thermoelectric material. A plurality of outer bridging metal ring members 104 are disposed on and joined to the thermoelectric washer members 98 and 100, the ring members each contacting a pair of p- and n-type thermoelectric washer members. The ring members 104 are electrically insulated from each other by means of insulating washer 102. A hollow concentric insulating cylindrical member 106 comprising a material such as that employed for reference numeral 93 is disposed about and joined to the outer ring members and the outer cylindrical metal member 94 is disposed about and joined to the insulating cylindrical member 106.

The isostatic hot pressing operation provides an intimate and effective metallurgical bond between the bridging metal ring members and the thermoelectric washers so as to provide good electrical contacts on the thermoelectric washer members whereby the thermoelectric washers are electrically connected in series. Also a good bond allowing good heat flow is formed between the outer cylindrical metal member 94 and the insulating cylindrical member 106 and between the insulating member 106 and the metal ring member 104. Electrical connector clamps 110 and 112 may be then attached to the thermoelectric element 90 to form a thermoelectric device 120. The device 120 may then be connected to a load 114 by means of electrical leads 116 and 118 attached to the clamps 110 and 112.

The reason for such an arrangement is that generally the inner cylindrical metal member of the devices is particularly suited to serve for passing high temperature gases and liquids so as to make this the hot side, and the outer cylindrical metal member of the device can be exposed to the cooling medium to serve as the cold side of a thermocouple. The inner cylindrical members may be conveniently heated by passing hot water, steam, a flame or the like therethrough. The outer cylindrical member may be cooled by flowing water or cold gases or air thereover. The difference in temperature between the hot side and the cold side will cause an electrical current to be generated in the thermoelectric device by a phenomenon which is known in the art as the Seebeck effect. However, it should be understood that the inner metal member may serve as the cold side and the outer metal member as the hot side.

Furthermore, the reverse of the Seebeck effect may be employed to produce refrigeration devices.

The following examples are illustrative of the teachings of the invention.

EXAMPLE I

A body of lead telluride thermoelectric material (1.5" x 1.1" x .16") containing a thin compressed layer of iron on each surface thereof was disposed between two sheets of copper having a thickness of 0.121". One surface of each sheet of copper was in mating relationship with the iron layer on the lead telluride body to form a sandwich arrangement. The thermoelectric body and copper conductors were wrapped in a sheet of carbon coated aluminum foil. The resultant assembly was then inserted in a thin walled stainless steel container which was arc welded, evacuated and sealed. The sealed container was disposed in an autoclave having a heating coil therein and a valve to admit an inert gas. A quantity of helium was admitted into the autoclave and the gas was compressed at 10,000 p.s.i. while a temperature of 400° C. was maintained therein. The assembly was subjected to that temperature and pressure for approximately 2 hours. The assembly was then removed from the autoclave and examined. It was found that a metallurgical bond resulted between the lead telluride body with the diffusion barrier layer of iron and the copper conductor. The deformation of the assembly as a result of the exerted temperature and pressure measured from .0045 to .0065 from center to end.

EXAMPLE II

A plurality of individual bodies of different thermoelectric materials were isostatically hot pressed and metallurgically bonded under different sets of conditions to various electrical conductors in the same manner as in Example I. The assemblies were subjected to a pressure of 10,000 p.s.i. at various times and temperatures. Each thermoelectric body was metallurgically bonded to the conductor member after isostatic deformation. In some cases the thermoelectric body was a compressed powder and contained a metallic diffusion barrier layer compressed on each end thereon. In other cases the thermoelectric body contained a plasma jet sprayed metallic layer on each end thereof. In still other cases a metallic foil was disposed between the electrical conductor and the thermoelectric body. However, in all cases a unitary body was provided after the deformation operation.

In Table I below, there is indicated the various thermoelectric bodies with or without diffusion barrier layers which were joined to a particular electrical conductor under different conditions wherein the deformation of the assembly was measured from end to end and the results thereby indicated. However, the deformation indicated herein resulted from further compaction of the thermoelectric material. A very slight deformation actually occurred to provide the desired bonds.

TABLE I

| Time and Temperature Conditions at 10,000 p.s.i. | Compound | Dimensions (inches) | Diffusion Barrier Layer | Conductor | Thickness (inch) | Deformation of Assembly (inch) |
|---|---|---|---|---|---|---|
| 2 hrs., 400° C | PbTe | 1.5 x 1.1 x .17 | Fe (cap) | Al | .124 | .002 to .007. |
| | PbTe | 1.5 x 1.1 x .17 | Fe (spray) | Cu | .130 | .0135 toj.0145. |
| | PbTe | 1.5 x 1.1 x .16 | do | Al | .130 | .009 to .012. |
| | GeBiTe | 1.5 x 1,1 x .15 | W (spray) | Cu | .127 | .0105 to .0165. |
| | ZnSb | 1.5 x 1.1 x .16 | Fe (foil) .005 in | Cu | .121 | .013 to .020. |
| | ZnSb | 1.5 x 1.1 x .16 | None | Cu | .121 | .001 to .007. |
| | ZnSb | 1.5 x 1.1 x .16 | Fe (foil), .005 in | Al | .124 | .005 (center). |
| | BiSbTe | 1.5 x .5 x .26 | Fe (spray) | Cu | .130 | .026 to .034. |
| | BiSbTe | 1.5 x .5 x .26 | None | Cu | .121 | .025 to .036. |
| | AgSbTe | 1.5 x 1.1 x .13 | Mo (spray) | Al | .131 | .001 to .013. |
| 2 hrs., 350° C | PbTe | 1.5 x 1.1 x .17 | Fe (cap) | Cu | .121 | .0005 to .0035. |
| | PbTe | 1.5 x 1.1 x .16 | do | Al | .124 | ,0015 to .0055. |
| | PbTe | 1.5 x 1.1 x ,16 | Fe (spray) | Al | .130 | .0005 to .0025. |
| | GeBiTe | 1.5 x 1.1 x .16 | W (spray) | Cu | .127 | .008 to .013. |
| | ZnSb | 1.5 x 1.1 x .16 | Fe (foil), .005 in | Cu | .121 | .006 to .010. |
| | ZnSb | 1.5 x 1.1 x .16 | None | Cu | .121 | .000 to .005. |
| | BiSbTe | 1.5 x .5 x .26 | Ni (spray) | Cu | .131 | .018 to .022. |
| | BiSbTe | 1.5 x .5 x .26 | Fe (spray) | Cu | .130 | .025 to .029. |
| | BiSbTe | 1.5 x .5 x .26 | None | Cu | .121 | .027 to .030. |
| | AgSbTe | 1.5 x 1.1 x .13 | Co (spray) | Al | .134 | .0085 to .0095. |
| | AgSbTe | 1.5 x 1.1 x .13 | Mo (spray) | Al | .131 | .010 to .016. |
| 1 hr., 600° C | PbTe | 1.5 x 1.1 x .17 | Fe (cap) | Cu | .121 | .0135. |
| | PbTe | 1.5 x 1.1 x .16 | Fe (spray) | Cu | .130 | .0135. |
| 2 hrs., 316° C | ZnSb | 1.5 x 1.1 x .16 | None | Cu | .121 | .0145. |
| | BiSbTe | 1.5 x .5 x .26 | do | Cu | .121 | .034. |
| | AgSbTe | 1.5 x 1.1 x .13 | Mo (spray) | Al | .131 | .0005 to .0045. |
| 2 hrs., 450° C | PbTe | 1.5 x 1.1- .17 | Fe (cap) | Cu | .121 | .0047. |
| | PbTe | 1.5 x 1.1 x .17 | Fe (spray) | Cu | .130 | .013 to .015. |
| | GeBiTe | 1.5 x 1.1 x .16 | Mo (spray) | Cu | .127 | .006 to .008. |
| | GeBiTe | 1.5 x 1.1 x .16 | W (spray) | Cu | .127 | .010to .016. |
| | ZnSb | 1.5 x 1.1 x .16 | Fe (spray) | Cu | .130 | .030 to .035. |
| | BiSbTe | 1.5 x .5 x .26 | do | Cu | .130 | .018. |
| | AgSbTe | 1.5 x 1.1 x .14 | Co (spray) | Al | .134 | .019. |
| 2 hrs., 500° C | PbTe | 1.5 x 1.1 x .17 | Fe (cap) | Cu | .121 | .006 to .010. |
| | PbTe | 1.5 x 1.1 x .17 | Fe (spray) | Cu | .130 | .015 to .020. |
| | GeBiTe | 1.5 x 1.1 x .15 | Mo (spray) | Cu | .127 | .006 to .015. |
| | GeBiTe | 1.5 x 1.1 x .16 | Nb (spray) | Cu | .132 | .021 to .024. |
| | GeBiTe | 1.5 x 1.1 x .16 | W (spray) | Cu | .127 | .010 to .015. |
| | ZnSb | 1.5 x 1.1 x .16 | Fe (spray) | Cu | .130 | .033. |
| | AgSbTe | 1.5 x 1.1 x .13 | Co(spray) | Al | .134 | .017 to .020. |
| 2 hrs., 600° C | PbTe | 1.5 x 1.1 x .16 | Fe (cap) | Cu | .121 | .007 to .010. |
| | PbTe | 1.5 x 1.1 x .16 | Fe (spray) | Cu | .130 | .010 to .0155. |
| 2 hrs., 550° C | PbTe | 1.5 x 1.1 x .17 | Fe (foil), .006 in | Cu | .127 | .004 to .006. |
| 2 hrs., 550° C | PbTe | 1.5 x 1.1 x .16 | do | Cu | .130 | .005 to .006. |
| 2 hrs., 550° C | PbTe | 1.5 x 1.1 x .16 | do | Al | .134 | .001 to .004. |
| | GeBiTe | 1.5 x 1.1 x .16 | Ni (foil), .055 in | Al | .130 | .015. |
| 2 hrs., 300° C | GeBiTe | 1.5 x 1.1 x .17 | do | Cu | .131 | .001 to .006. |

EXAMPLE III

A thermoelectric device similar to that shown in FIG. 8 was assembled. The inner cylindrical member employed was a stainless steel hollow tube having a 0.376" I.D. and 0.426" O.D. and having a 0.015" thick tube of boron nitride disposed thereon. The bridging contact ring members consisted of low carbon steel and were of two different sizes. The inner contacts measured 0.460" I.D. and 0.514" O.D. The outer contacts measure 0.76" I.D. and 0.79" O.D. The thermoelectric washers employed consisted of p- and n-type lead telluride having a density of 90% of theoretical and measuring 0.764" O.D. and 0.516" I.D. The insulating material between alternate thermoelectric washers and bridging contacts consisted of mica washers and were of two sizes. The inner insulating washers measured 0.764" O.D. and 0.460" I.D. The outer insulating washers measured 0.788" O.D. and 0.516" I.D. The outer bridging contacts had a 0015" thick boron nitride tube disposed thereon. The outer cylindrical member consisted of a stainless steel tube 10" long and measuring 0.870" O.D. and 0.821" I.D. The total gap space of the assembly in the radial direction was 0.006".

End plugs consisting of a stainless steel sheet were then inserted and welded at the ends of the assembly to the inner and outer tubes and the annular area between the inner and outer tubes of the assembly was evacuated. The assemblies were each disposed in a separate autoclave and treated in a similar manner. A pressure of 10,000 p.s.i. was imposed on the assembly at room temperature. The assemblies were then heated to 650° C. while maintaining the same pressure and they were held at that temperature and pressure for two hours. The assemblies were then cooled and the pressure decreased to about 4000 or 5000 p.s.i., the decrease in pressure being linear with the decrease in temperature. The gas pressure maintained in the autoclave was through the use of helium gas. However, other inert gases may be employed.

The devices were tested by inserting a rod heater and thermocouples in each bore. A temperature difference of 168° C. was maintained between the outer and inner cylindrical members when the outer side was cooled with water. Wire leads were attached as shown in FIG. 8 and electrical measurements were taken and the efficiency calculated. The reduction in diameter of the assembly after isostatic deformation and the various electrical test results are indicated in Table II.

ployed in Example I may be substituted for the materials in the above example provided that the proper temperature is chosen at which to carry out the isostatic pressing operation.

It is intended that the foregoing description and drawings be construed as illustrative and not limiting.

I claim as my invention:

1. In the process of producing a thermoelectric element, the steps comprising (1) disposing at least one body of a thermoelectric material formed from a material selected from the group consisting of semiconductive materials, refractory metals and ceramic materials and mixtures thereof within a compartment formed at least in part from a conductive metal member conforming in shape to at least a portion of the periphery of said body, (2) sealingly enclosing said body within said compartment to provide a closure therefor, (3) evacuating the closure, (4) then hot pressing the entire assembly at a temperature from about 250° C. to slightly below the melting temperature of the lowest melting temperature component in the assembly at an isostatic pressure of from about 5000 p.s.i. to 50,000 p.s.i. until the metal member has a reduction in area of from about one to fifteen percent to provide a metallurgical bond between the portion of the periphery of the thermoelectric body and the walls of the metal member part.

2. In the process for producing a thermoelectric element, the steps comprising disposing a plurality of inner bridging metal ring members on an insulated cylindrical metal member, the ring members being electrically insulated from each other, disposing a plurality of washers of thermoelectric material formed from a material selected from the group consisting of semiconductive materials, refractory metals and ceramic materials and mixtures thereof on the ring members, disposing a plurality of outer bridging metal ring members on said thermoelectric washers, the ring members being electrically insulated from each other, disposing an insulated outer cylindrical metal member on the ring members, mechanically deforming the assembly to provide a gap space of not above about one percent of the diameter of the outer cylindrical member, through the ends of the cylindrical metal members to provide a closure for the individual components therein and evacuating the sealed assembly, then deforming the assembly at a temperature of from 250° C. to slightly below the melting temperature of the lowest melting temperature component in the assembly at an isostatic pressure of from 5,000 p.s.i. to 50,000 p.s.i. until there is a reduction in area of the space between the inner and outer cylindrical members of from about one percent to fifteen percent to provide a metallurgical bond between the bridging metal ring members and the thermoelectrical washers so that an applied or induced current will flow between said washers.

3. In the process of producing a thermoelectric element, the steps comprising disposing a relatively thin insulating cylindrical member consisting of boron nitride on an inner cylindrical member consisting of stainless steel, disposing a plurality of inner bridging metal ring members on the insulating cylindrical member, the ring members being electrically insulated from each other with mica, disposing a plurality of washers of thermoelectric

TABLE II

| O.D. (in.) Initial | O.D. (in.) After Isostatic Deformation | Initial Room Temperature Resistance (ohms×10³) | Resistance (ohms×10³) | Open-Circuit Voltage (volts) | Power Output (volts) | Overall Efficiency (Percent) |
|---|---|---|---|---|---|---|
| 0.870 | 0.844 | 5.21 | 35.5 | 1.27 | 11.5 | 2.05 |
| 0.870 | 0.845 | 5.00 | 35.5 | 1.08 | 8.2 | 1.90 |
| 0.870 | 0.847 | 3.55 | 32.0 | 1.10 | 9.8 | 2.00 |
| 0.870 | 0.844 | 4.12 | 31.7 | 0.70 | 3.8 | 1.08 |
| 0.870 | 0.839 | 5.40 | 37.1 | 0.91 | 5.6 | 1.59 |

It should be understood that the components of the assembly should be designed so that they fit closely together in the assembly so that the total gap space in a radial direction is as small as possible. Since the total gap space in the assemblies tested was only about 0.006", the deformation caused by the isostatic pressures was enough to take up the gap space, and to provide the necessary bonds between the components. However, if the gap space is of too high a value, the assembly may initially be deformed by some mechanical means, such as, swaging to close up the gap space as much as possible. Then, the assembly may be processed in accordance with the invention with good results.

It should also be understood that other thermoelectric materials such for example as germanium telluride, zinc antimonide, or any of the thermoelectric materials emmaterial comprising p- and n-type lead telluride on the ring members, disposing a plurality of outer bridging ring members on said thermoelectric washers, the ring members being electrically insulated from each other, disposing an outer insulating cylindrical member consisting of boron nitride on the ring members, disposing an outer cylindrical metal member consisting of stainless steel on the insulating cylindrical member to provide a closely packed assembly, sealing the ends of the cylindrical metal members to provide a closure for the individual components therein and evacuating the sealed assembly, then deforming the entire assembly at a temperature of from 250° C. to slightly below the melting temperature of the lowest melting temperature components at an isostatic pressure of from 5,000 p.s.i. to 50,000 p.s.i. until the reduction in area of the space between the inner and outer cylindrical metal member is from about one percent to fifteen percent to provide a metallurgical bond between the bridging metal ring members and the thermoelectric washers so that an applied or induced current will flow between said washers.

4. The process of claim 1 wherein a plurality of bodies of thermoelectric material are disposed in a plurality of separate compartments formed within the metallic member to form a closely packed assembly.

5. The process of claim 4 wherein the thermoelectric bodies of adjacent compartments are of different thermoelectric compositions and different thermoelectric conductivity and wherein said adjacent compartments are separated by a non-reactive insulating partition.

6. The process of claim 1 wherein the body of thermoelectric material is of annular configuration and wherein the inner and outer peripheries of the compartment are formed from a pair of concentric metal cylinders which closely receive the body of thermoelectric material therebetween.

References Cited

UNITED STATES PATENTS

| | | | |
|---|---|---|---|
| 3,018,238 | 1/1962 | Layer | 29—470.1 |
| 3,214,295 | 10/1965 | Danko | 136—202 |
| 3,243,869 | 4/1966 | Sandberg | 136—201 X |

WILLIAM I. BROOKS, *Primary Examiner.*